United States Patent [19]

Bujtas

[11] Patent Number: 5,317,482
[45] Date of Patent: May 31, 1994

[54] CLAMP ACTIVATOR AND CIRCUIT CARD EXTRACTOR

[75] Inventor: Geza Bujtas, Boonton, N.J.

[73] Assignee: Smith Industries, N.J.

[21] Appl. No.: 987,169

[22] Filed: Dec. 7, 1992

[51] Int. Cl.⁵ .............................................. H05K 7/00
[52] U.S. Cl. ...................................... 361/798; 211/41;
361/785; 439/157
[58] Field of Search ...................... 312/332.1; 211/41;
361/386, 388, 399, 412, 413, 415, 784, 785, 788,
796, 798, 704, 707, 709, 720; 439/64, 74, 152,
153, 155, 157, 160, 296, 325, 358, 362, 633

[56] References Cited

U.S. PATENT DOCUMENTS

| | | | |
|---|---|---|---|
| 4,414,605 | 11/1983 | Chino | 361/388 |
| 4,606,591 | 8/1986 | Bloch | 339/45 M |
| 4,740,164 | 4/1988 | Schulz | 439/64 |
| 4,914,552 | 4/1990 | Kecmer | 361/415 |
| 4,975,073 | 12/1990 | Weisman | 439/157 |
| 5,003,431 | 3/1991 | Imsdahl | 361/415 |

FOREIGN PATENT DOCUMENTS 0076798 3/1989 Japan ..................................... 361/415

OTHER PUBLICATIONS

Calmark, Series 103 Card Extractor, p. 1, Jun. 1973, San Marino, Calif.

Primary Examiner—Gerald P. Tolin
Attorney, Agent, or Firm—Anthony J. Casella; Gerald E. Hespos

[57] ABSTRACT

A wedge clamp activator and circuit card extractor is provided for selective tightening and loosening of a wedge clamp on an electrical apparatus. The actuator includes a shaft for rotating the screw of the wedge clamp. The shaft is provided with pivot pins. A lever mounted to the pivot pins enables rotation of the actuator and the wedge clamp screw to which the actuator is attached. The lever includes a fulcrum dimensioned for engagement with a rigid support on the electrical apparatus. The lever may be translated into a position where the fulcrum engages the support. The lever may then be rotated about the fulcrum for extracting the circuit to which the wedge clamp is mounted from the electrical apparatus.

10 Claims, 2 Drawing Sheets

CLAMP ACTIVATOR AND CIRCUIT CARD EXTRACTOR

BACKGROUND OF THE INVENTION

1. Field of the Invention

The subject invention relates to an apparatus for activating and deactivating a wedge clamp on a circuit card and to facilitate extraction of the circuit card from an electrical apparatus.

2. Description of the Prior Art.

Prior art electrical and electromechanical apparatus include circuit boards to which a plurality of circuit cards are connected. Electrical components and circuitry on the circuit card may be required to supplement or control functions enabled by circuits and components on the circuit board. However, the circuit card must be removably engageable with the circuit board to enable replacement of damaged components or to alter the performance of the apparatus.

Circuit boards with circuit cards removably connected thereto often are used in high-vibration environments, such as on aircraft and in some land vehicles. Vibrations can cause the circuit card to vibrate free of its electrical connection with the circuit board. An unintentional separation of a circuit card from a circuit board can have a catastrophic effect on the performance of the apparatus in which the electrical circuitry is disposed.

The prior art has recognized a need to securely, but releasably, clamp a circuit card into an electrically connected condition on a circuit board. A prior art electrical apparatus with a circuit board and a clampingly engageable circuit card is illustrated schematically in FIGS. 1 and 2 and is identified generally by the numeral 10. The prior art apparatus 10 includes a circuit board 12 having a substrate 14 with an array of circuits printed or otherwise disposed thereon. Electrical components will be connected to conductive traces on the substrate 14 in accordance with the function to be performed by the apparatus 10. The circuitry and electrical components do not form a part of the subject invention, and are not illustrated in FIGS. 1 and 2.

The circuit board 12 further includes at least one socket 16 mounted to the substrate 14. The socket 16 includes a plurality of apertures 18 and a corresponding plurality of electrically conductive terminals (not shown) mounted therein. Each terminal will include a contact portion aligned with the corresponding aperture 18 and a solder tail, or other such member, for soldered electrical connection to an appropriate conductive trace on the substrate 14. The prior art circuit board 12 further includes a chassis 20 having pairs of spaced apart parallel front and rear clamping walls 22 and 24 and an end wall 25 projecting rigidly from the substrate 14 and defining a card receiving channel 26 therebetween.

The prior art apparatus 10 further includes a circuit card 28 having a substrate 30 with electrically conductive circuits and components thereon to supplement the circuits and components of the circuit board 12. The circuit card 28 further includes a multi-terminal plug 32 having a housing 34 mechanically mounted to an edge region of the substrate 30. A plurality of electrically conductive terminals are mounted in the housing 34 and include contact pins 36 which project from the housing 34 of the plug 32. The terminals of the plug 32 are electrically connected to circuitry on the card 28 by leads illustrated schematically in FIG. 1 and identified generally by the numeral 38. The pins 3 of the plug 32 are disposed and dimensioned to enter the apertures 18 of the socket 16 and make electrical contact with the terminals thereof.

The apparatus 10 further includes a pair of prior art wedge clamps 40 mounted to opposed edges of the substrate 30. The prior art wedge clamp 40 includes a plurality of generally prismatic wedges 42, 44 and 46 having opposed faces disposed in sliding contact with one another. A threaded screw extends through the wedges 42-46 and include a head 48 dimensioned and configured to be engaged by a prior art Allen wrench 50, as shown schematically in FIG. 2. In a loosened condition, the side faces of the prismatic wedges 42-46 will be generally registered with one another and in common respective planes. In this loosened condition, the circuit card 28 and the prior art wedge clamp 40 can be slid easily into the channel 26 defined between the front and rear clamping walls 22 and 24. The prior art Allen wrench 50 then can be engaged with the head 48 to tighten the screw. As illustrated in FIG. 2, this tightening causes the prismatic wedges 42 and 46 to slide toward one another and along the opposed end faces of the prismatic wedge 44. This effectively increases a cross-sectional dimension of the prior art prismatic wedge 40 and causes the substrate 30 and the prior art wedge clamp 40 to be tightly clamped between the front and rear clamping walls 22 and 24 of the chassis 20 as illustrated in FIG. 2.

The prior art apparatus 10 with the prior art wedge clamp 40 as shown in FIGS. 1 and 2 has worked successfully for releasably clamping a prior art circuit card 28 in a connected condition relative to a circuit board 12. However, the clamping and unclamping of the circuit card 28 relative to the circuit board 12 requires the technician to have access to an appropriately dimensioned Allen wrench 50. The availability of the required Allen wrench may not be a problem in a well appointed laboratory or work shop. However, circuit card replacements often are made in the field where the technician cannot be assured of access to the required tools. The technician may resort to merely sliding the prior art circuit card 28 into connection on the circuit board 12 without activating the wedge clamp 40. Hence, the circuit card 28 will be susceptible to unintended separation when exposed to a high vibration environment.

To remove the prior art circuit card 28 from the circuit board 12, the prior art wedge clamp 40 must be loosened and a pulling force must be exerted on the circuit card 28. The pulling force is required to overcome the contact forces between terminals in the socket 16 and the pins 36 in the plug 32. The contact forces between each pair of mated terminals is fairly low and can be overcome easily with a simple application of manual force. However, the connectors 16 and 32 are likely to have a large number of mated terminals (e.g., 64 mated pairs) and the unmating forces for the circuit card 28 is the sum of the unmating forces required for each pair of mated terminals. These combined unmating forces can be very high, and may require the technician to use a separate extraction tool. As noted above, a technician working in the field cannot be assured of having full access to available tools. Improper application of forces on a circuit card by using either the wrong tool or no tool at all can damage either the circuit card 28 or the board 12.

In view of the above, it is an object of the subject invention to facilitate the clamped retention of a circuit card to a circuit board.

It is another object of the subject invention to facilitate the extraction of a circuit card from a circuit board.

It is a further object of the subject invention to avoid the need for separate tools to insert or extract a circuit card from a circuit board.

SUMMARY OF THE INVENTION

The subject invention is directed to an apparatus which enables the selective tightening and loosening of a wedge clamp. The apparatus of the subject invention further enable efficient extraction of a circuit card to which the wedge clamp is mounted. The apparatus of the subject invention comprises a lever mounted to the actuating screw of a wedge clamp or to an extension of the actuating screw. The lever may be disposed to extend in a direction generally transverse to the wedge clamp and the actuating screw thereof. Thus, the lever may be used to rotate the actuating screw about its longitudinal axis for selectively loosening or tightening the wedge clamp.

The lever of the subject apparatus may further be pivotable about an axis extending transverse to the longitudinal axis of the actuating screw. Pivotable movement of the lever relative to the wedge clamp can be used to extract the circuit card from the circuit board. More particularly, the actuating screw of the wedge clamp or an extension thereof may include a pivot pin extending transverse to the longitudinal axis of the screw. The lever may include a pin slot into which the pin of the actuating screw is engaged. The pin slot preferably extends generally transverse to the longitudinal axis of the actuating screw. Thus, the lever can pivot about the pin of the actuating screw and can be slid generally transversely to the actuating screw. The slidable movement of the lever relative to the actuating screw enables a fulcrum portion of the lever to be slid into engagement with the chassis of the circuit board. One end of the lever can be rotated about the pin, thereby urging the fulcrum end of the lever into engagement with the chassis and enabling efficient extraction of the circuit card from the socket on the circuit board. The lever is dimensioned and disposed to remain permanently attached to the wedge clamp without significantly increasing the space required for the interconnected circuit card and circuit board.

The apparatus of the subject invention can be easily employed to selectively tighten or loosen the wedge clamp without the need to resort to a separate Allen wrench or other such tool. Similarly, the apparatus of the subject invention can be employed to enable efficient extraction of the circuit card. Permanent mounting of the lever to the wedge clamp and the associated circuit card ensures that the technician will properly tighten the connected circuit card in place and will not exert improper forces in an attempt to extract the circuit card from the board.

DETAILED DESCRIPTION OF THE PREFERRED EMBODIMENT

Figure 2:
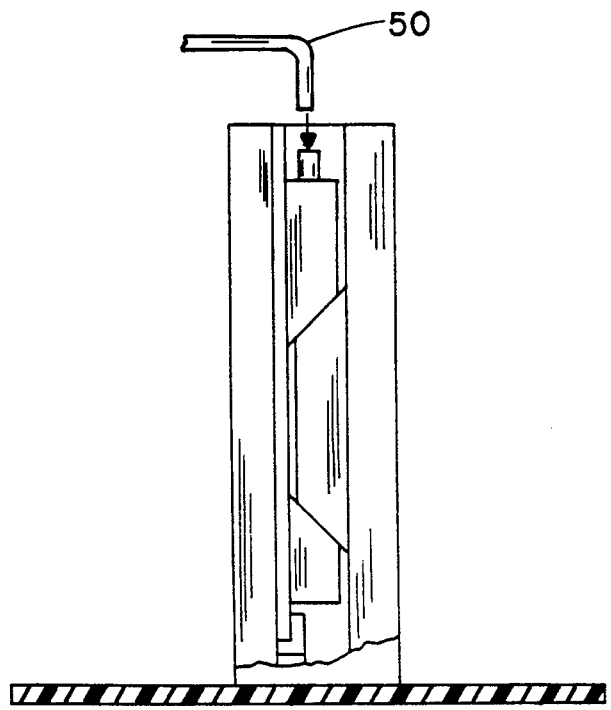
FIG. 2 is a side elevational view, partly in section, of the assemble prior art circuit card and board shown in FIG. 1.
Figure 3:
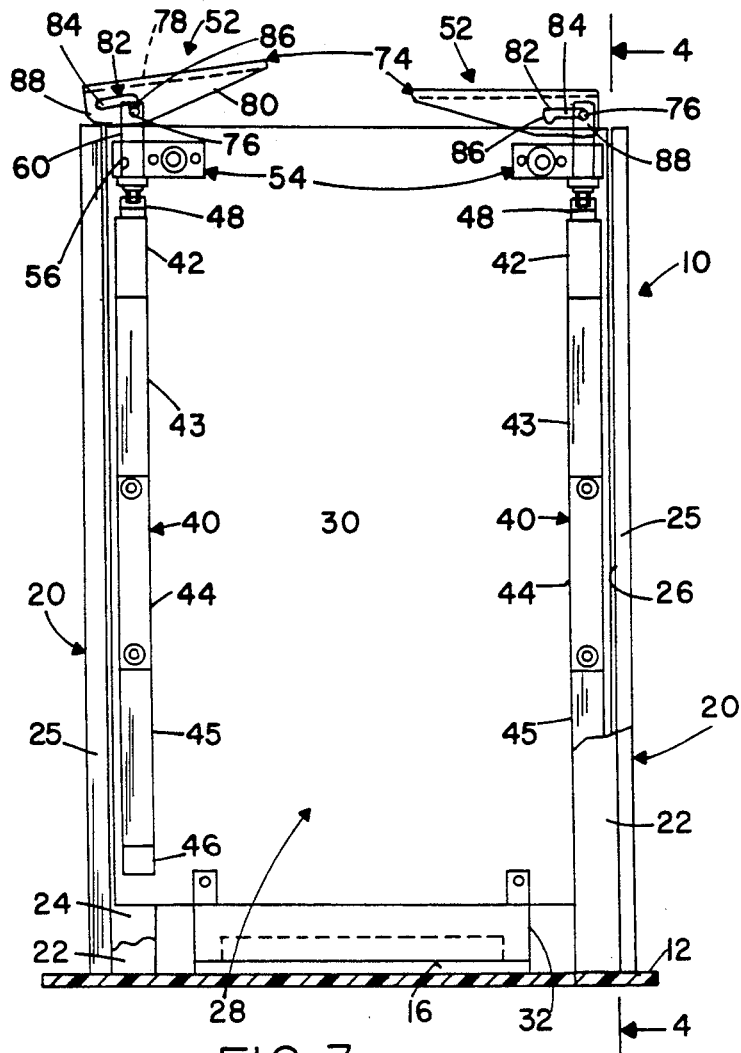
FIG. 3 is a front elevational view of a circuit card and circuit board with the clamp actuator and extractor apparatus of the subject invention.
Figure 4:
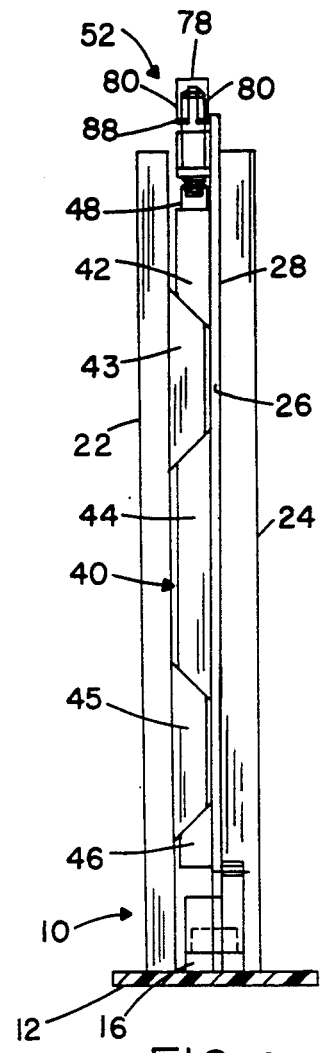
FIG. 4 is a cross-sectional view taken along line 4—4 in FIG. 3.
Figure 5:
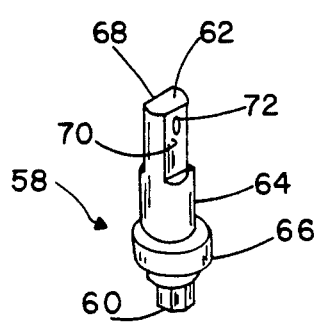
FIG. 5 is a perspective view of an adapter shaft for joining the lever of the subject invention to a prior art wedge clamp.

A wedge clamp activator and circuit card extractor in accordance with the subject invention is identified generally by the numeral 52 in FIGS. 3–5. The wedge clamp activator and circuit card extractor 52 can be used in a prior art electrical apparatus 10 as described above and illustrated in FIGS. 1 and 2. For simplicity, the numeric references that were employed in FIGS. 1 and 2 to describe the prior art apparatus 10 are carried over to FIGS. 3 and 4 to identify relevant portions of the prior art apparatus with which the wedge clamp activator and circuit card extractor 52 are used.

Figure 1:
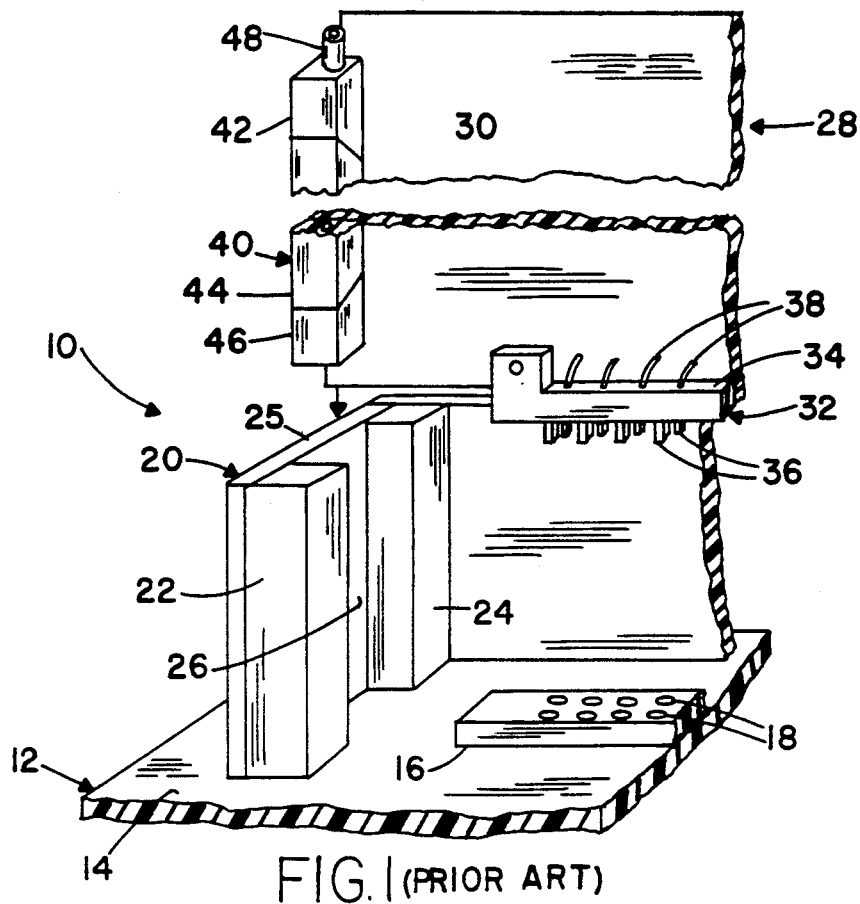
FIG. 1 is a perspective view of a prior art circuit board and circuit card combination shown partly in section.

Briefly, with reference to FIG. 3, a multi-terminal plug 32 on a circuit card 28 is electrically and mechanically connected to a multi-terminal socket 16 on a circuit board 12 of an apparatus 10. The prior art apparatus 10 with which the wedge clamp activator and circuit card extractor 52 is employed further includes a chassis 20 having pairs of spaced apart parallel front and rear clamping walls 22 and 24 and an end wall 25 projecting rigidly from the circuit board 12. Additionally, as illustrated in FIGS. 1 and 2 above, the circuit card 28 has wedge clamps 40 affixed to the substrate 30 of the circuit card 28 in proximity to edge regions thereof. Each wedge clamp 40 includes a plurality of generally prismatic wedges 42–46 with end faces thereof disposed in sliding contact with one another. A threaded screw extends longitudinally through the wedges 42–46. A head 48 is mounted to the screw for rotation therewith and projects beyond the prismatic wedge 42. Rotation of the head 48 in a first rotational direction urges the wedge 42 toward the wedge 46, and thereby increases the cross-sectional dimension of the wedge clamp 40 for clampingly engaging the respective front and rear clamping walls 22 and 24 of the chassis 20, as illustrated in FIG. 4. Conversely, rotation of the head 48 in an opposed rotational direction urges the wedge 42 away from the wedge 46 and decreases the cross-sectional dimension of the wedge clamp 40 to enable separation of the wedge clamps 40 and the circuit card 28 from the chassis 20 of electrical apparatus 10.

The wedge clamp activator and circuit card extractor 52 of the subject invention includes bearing blocks 54 mounted to the substrate 30 of the circuit card 28. The bearing blocks 54 include generally cylindrical bearing apertures 56 passing therethrough in registration with the wedge clamp activating screw and the actuating head 48 thereof.

The wedge clamp activator and circuit card extractor 52 further includes an elongate actuator shaft 58 having opposed first and second ends 60 and 62 respectively. The first end 60 of the actuator shaft 58 is of generally hexagonal cross-sectional shape and is dimensioned to be non-rotatably engaged with the head 48 of the wedge clamp screw. Thus, rotation of the actuator shaft 58 about its longitudinal axis will generate corresponding rotation of the wedge clamp screw about its axis. The actuator shaft 58 further includes a generally cylindrical portion 64 intermediate the opposed first and second ends 60 and 62. The cylindrical portion 64 of the actuator 58 is rotatably disposed in the cylindrical aperture 56 passing through the bearing block 54. The actuator 58 further includes an outwardly directed bearing flange 66 disposed intermediate the cylindrical portion 64 and the hexagonal end 60. More particularly, the outwardly extending bearing flange 66 defines a cross-sectional dimension greater than the cross-sectional area of the aperture 56 through the bearing block 54. Hence, as shown most clearly in FIGS. 3 and 4, the bearing flange 66 is disposed intermediate the bearing block 54 and the head 48 of the screw through the wedge clamp 40.

The second end 62 of the actuator shaft 58 projects beyond the bearing block 54. Additionally, the second end 62 of the actuator shaft 58 projects beyond the top edge of the circuit card 28 and beyond the upper end of the chassis 20. Portions of the actuator shaft 58 between the second end 6 and the cylindrical portion 64 are characterized by a pair of planar faces 68 and 70 which are aligned parallel to one another and parallel to the longitudinal axis of the actuator shaft 58. A pivot aperture 72 extends through portions of the shaft 58 defining the planar faces 68 and 70. The pivot aperture 72 passes through the longitudinal axis of the actuator shaft 58 at substantially right angles thereto.

The wedge clamp activator and circuit card extractor 52 further includes a lever 74 pivotably mounted to a pin 76 passing through the pivot aperture 72. The lever 74 includes an elongate central support 78 and a pair of opposed side flanges 80 which are substantially parallel to one another and substantially perpendicular to the central support 78. The parallel flanges 80 are provided with substantially identically configured slots 82 respectively. With reference to FIG. 3, the slot 82 includes a first leg 84 aligned substantially parallel to the central support 78 and a second leg 86 angularly aligned thereto. The slot 82 is dimensioned to enable the lever 74 to translate along the pin 7 from a first position as depicted in the top right of FIG. 3 to a second position as depicted in the top left of FIG. 3.

The flanges 80 are further provided with fulcrums 88 at corner portions thereof in proximity to the slots 82. More particularly, the flanges 80 are dimensioned such that the fulcrums 88 are spaced from the chassis 20 when the lever 74 is translated toward the center of the circuit card 28, as depicted in the upper right corner of FIG. 3. Conversely, the flanges 80 are dimensioned such that the fulcrums 88 engage the end wall 25 of the associated chassis 20 when the lever 74 is translated away from the center of the circuit card 28, as depicted most clearly in the upper left corner of FIG. 3. The end 90 of the lever 74 remote from the fulcrum 88 defines an actuator for pivoting the lever 74 about the pin 76.

The wedge clamp activator and circuit card extractor 52 can be used to selectively tighten or loosen the wedge clamp 40 by urging the lever 74 toward a central portion of the circuit card 28 as depicted in the upper right corner of FIG. 3. The lever 74 may then be used to rotate the head 48 and the wedge clamp screw attached to the head 48 about their respective longitudinal axes. In this regard, a rotational force applied to the lever 74 is transmitted through the pivot pin 76 and to the actuator shaft 58. The hexagonal first and end 60 of the actuator shaft 58 transmits these rotational forces to the head 48 and then to the wedge clamp screw for selectively loosening or tightening the wedge clamp 40. In view of the fact that the wedge clamp activator and circuit card extractor 52 is permanently attached to the circuit card 28, it is unnecessary for the technician to employ a separate tool such as an Allen wrench.

As noted above, removal of the circuit card 28 from the apparatus 10 often is difficult even after the wedge clamp 40 has been loosened. In particular, mating forces exerted by terminals the socket 16 on the multi-terminal plug 32 can result in very high unmating forces. To overcome these forces, the lever 74 can be urged away from the central part of circuit card 28 as depicted most clearly in the upper left corner of FIG. 3. In this orientation, the fulcrums 88 are initially disposed directly over the top of the end support 25 of each chassis 20. The actuating end of the lever 74 then can be urged upwardly and away from the circuit card 28 such that the pivot pin 76 advances into the small leg 86 of the slots 82 and such that the fulcrums 88 are urged downwardly and into secure engagement with the top edge of the end support 25 of the chassis 20. Further upward movement on the actuating end of the lever 74 will cause the lever 74 to rotate about the fulcrums 88 with the circuit card being drawn upwardly and out of its mated engagement with the socket 16. The mechanical advantage achieved by the two levers 74 working simultaneously on the chassis 20 enables an efficient unmating and extraction of the circuit card 28.

While the invention has been described with respect to a preferred embodiment, it is apparent that various changes can be made without departing from the scope of the invention as defined by the appended claims. In particular, the subject wedge clamp activator and circuit card extractor can be used in virtually any electrical apparatus employing wedge clamps. The levers and the actuator shafts need merely be dimensioned to accommodate the dimensions of the electrical apparatus to which the wedge clamp is attached. Additionally, the levers can be permanently connected to the wedge clamp screw.

What is claimed is:

1. A wedge clamp activator and circuit card extractor for an electrical apparatus, the apparatus having a circuit board, a chassis mounted to the circuit board, the chassis having opposed card receiving channels, a socket mounted to the circuit board intermediate the channels, a circuit board having sides slidably receivable in the channels and having an edge region selectively engageable with the socket, wedge clamps mounted to the respective sides of the circuit card and being slidably receivable in the respective channel, each of the wedge clamps including a plurality of wedges and elongate threaded means having a first end and an opposed second end which is threadedly engaged with one of the wedges, the threaded means being rotatable about a rotational axis for selectively clamping the wedge clamp and the circuit card in one of the channels of the chassis, said wedge clamp activator and circuit card extractor comprising:

a level having an actuator end and an opposed fulcrum end, portions of said lever intermediate said ends being permanently pivotably connected to the first end of the elongate threaded means for rotatably driving the elongate threaded means about the rotational axis and for pivoting movement about a pivot axis orthogonal to the rotational axis of the elongated threaded means, said fulcrum end being spaced from the pivot axis a sufficient distance such that said fulcrum end selectively engages with the chassis when said lever is pivoted about said pivot axis and urges the circuit card from the socket.

2. A wedge clamp activator and circuit card extractor as in claim 1, wherein said pivot axis is defined by a pivot pin engaged in said elongate threaded means, and wherein said lever includes an elongate slot, said pivot pin extending through said elongate slot such that said lever is translatable in a direction angularly aligned to the rotational axis of the longate threaded means and into a position where said fulcrum end engages said chassis.

3. A wedge clamp activator and circuit card extractor as in claim 1, wherein the second end of said elongate threaded means comprises a screw threadably engaged with one of the wedges and wherein the first end of the threaded means comprises an actuator shaft having an end rigidly mounted to the screw for rotation therewith, the pivot axis being disposed on the actuator shaft, such that said lever rotatably drives both the actuator shaft and the screw.

4. A wedge clamp activator and circuit card extractor as in claim 3 further comprising a bearing block securely mounted to the circuit card of the electrical apparatus and having an aperture extending therethrough, said shaft being rotatably disposed in said aperture of said bearing block such that said bearing block is intermediate said pivot axis and said screw, said actuator shaft comprising a bearing flange intermediate the bearing block and the screw, said bearing flange defining a crosssectional area greater then the aperture through the bearing block, such that the pivoting of said lever about said pivot axis and about said fulcrum end urges said bearing flange of said shaft into engagement with the bearing block for extracting the circuit card from the socket.

5. A wedge clamp activator and circuit card extractor as in claim 3, wherein the shaft includes a pair of planar surfaces adjacent the second end thereof, said surfaces being substantially parallel to one another and substantially parallel to the axis of the shaft, said lever having first and second flanges disposed respectively in sliding engagement with the planar surfaces of the shaft such that said lever is non-rotatably disposed about the longitudinal axis of the shaft and such that rotational forces delivered to said lever are transmittable to said shaft for rotating said shaft about its longitudinal axis.

6. A wedge clamp activator and circuit card extractor as in claim 3, wherein said lever is translatable between a first position where said fulcrum end is offset from the chassis of the electrical apparatus and a second position where said fulcrum and is aligned with the chassis.

7. A wedge clamp activator and circuit card extractor as in claim 6, wherein said pivot axis is defined by a pivot pin extending generally transverse to the actuator shaft, said lever comprising a slot slidably engaging the pivot pin and aligned to enable translation of said lever relative to the actuator shaft from said first position where said fulcrum end is spaced from the chassis of the electrical apparatus to said second position where said fulcrum end engages the chassis.

8. A wedge clamp activator and circuit card extractor as in claim 7, wherein said slot includes a first leg extending generally parallel to the lever and a second leg extending generally transverse to the first leg at a location on said slot remote from said fulcrum end, said second leg being shorter than said first leg and being dimensioned for secure engagement of said pin when said lever is pivoted for urging the circuit card from the socket of the apparatus.

9. A wedge clamp activator and circuit card extractor for use with a circuit card having a wedge clamp securely mounted thereto for clampingly securing said circuit card to a chassis, said wedge clamp including a plurality of prismatic wedge sections slidingly engageable with one another and a screw extending through said prismatic sections for selectively urging said sections toward one another, said wedge clamp activator and circuit card extractor comprising:

a bearing block securely mounted to the circuit card, said bearing block having an aperture passing therethrough and registered with the screw of the wedge clamp;

a shaft having opposed first and second ends, portions of said shaft intermediate said first and second ends being rotatably disposed in the aperture of the bearing block, said first end being non-rotatably engaged with the screw of the wedge clamp, the second end of the shaft projecting beyond the bearing block and having a pair of opposed parallel surfaces aligned substantially parallel to one another and substantially parallel to the longitudinal axis of said shaft, a pin aligned orthogonal to the longitudinal axis of the shaft passing through the parallel planar surfaces of the shaft in proximity to the second end thereof, a bearing flange extending outwardly from said shaft at locations intermediate the first end of the shaft and the bearing block, said flange defining a cross-sectional area greater than the aperture through the bearing block; and an elongate lever having opposed first and second ends and a central support extending therebetween, opposed parallel flanges extending from the central support, said flanges being disposed in sliding engagement with the parallel surfaces adjacent the second end of the shaft, said flanges of said lever having slots slidably engaged with the pin at the second end of the shaft such that said lever can be translated in directions orthogonal to the shaft between a first position and a second position, said first end of said lever defining a fulcrum dimensioned to engage the chassis when the lever is in the first translated position on said shaft, said second end of said lever defining an actuator for pivoting said lever about said pin on said shaft, whereby said lever enables rotation of said shaft about its axis for rotating the wedge screw to selectively loosen or tighten said wedge clamp, and whereby said fulcrum can be translated into engagement with the chassis, and said lever can be pivoted about said pin and against the chassis for extracting the circuit card from the chassis.

10. An electrical apparatus comprising:

a circuit board having an electrical connector mounted thereon, a chassis extending rigidly from said circuit board and defining channels on opposite respective sides of the connector on the circuit board;

a circuit card having a connector mounted to an edge region thereof for mating engagement with the connector on the circuit board, said circuit card being in sliding engagement in the channels defined by the chassis of the circuit board;

a pair of wedge clamps securely mounted to the circuit card and in sliding engagement in the channels, each said wedge clamp having a plurality of prismatic sections slidably engageable with one another and an actuating screw for selectively urging said prismatic sections toward and away from one another for alternately tightening and loosening said wedge clamp and said circuit card in the channels of said chassis; and first and second wedge clamp activators and circuit card extractors rigidly mounted to the circuit card, each said wedge clamp activator and circuit card comprising a bearing block having an aperture extending therethrough and aligned with a respective one of the actuator screws, a shaft extending through the aperture in the respective bearing block, said shaft having a first end non-rotatably engaged with the actuator screw, a bearing flange extending outwardly on said shaft and being removably engaged with portions of said bearing block in proximity to the aperture, a lever mounted to said shaft, said lever being pivotable and slidable with respect to said shaft, said lever including a fulcrum selectively engageable with and pivotable about said chassis, such that pivotable movement of said lever when said fulcrum is engaged with the chassis, urges said bearing flange against the bearing block such that said lever can be pivoted relative to said shaft for extracting the circuit card from said channels, and whereby said lever angles transmission of rotating forces to said shaft and to said screw for selectively tightening and loosening the wedge clamp.

* * * * *